(12) United States Patent
Yamamoto

(10) Patent No.: US 11,792,978 B2
(45) Date of Patent: Oct. 17, 2023

(54) SEMICONDUCTOR STORAGE DEVICE AND MANUFACTURING METHOD OF THE SAME

(71) Applicant: Kioxia Corporation, Tokyo (JP)

(72) Inventor: Koichi Yamamoto, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 166 days.

(21) Appl. No.: 17/118,932

(22) Filed: Dec. 11, 2020

(65) Prior Publication Data
US 2021/0296339 A1 Sep. 23, 2021

(30) Foreign Application Priority Data

Mar. 18, 2020 (JP) ................................. 2020-047085

(51) Int. Cl.
| | |
|---|---|
| *H10B 41/27* | (2023.01) |
| *H01L 23/522* | (2006.01) |
| *G11C 5/02* | (2006.01) |
| *H01L 21/768* | (2006.01) |
| *G11C 5/06* | (2006.01) |
| *H10B 43/27* | (2023.01) |

(52) U.S. Cl.
CPC ............. *H10B 41/27* (2023.02); *G11C 5/025* (2013.01); *G11C 5/06* (2013.01); *H01L 21/76802* (2013.01); *H01L 23/5226* (2013.01); *H10B 43/27* (2023.02)

(58) Field of Classification Search
CPC ......... H01L 27/11575; H01L 27/11548; H01L 27/11582; H01L 27/11556
See application file for complete search history.

(56) References Cited

U.S. PATENT DOCUMENTS

| | | |
|---|---|---|
| 10,020,319 B2 | 7/2018 | Baba |
| 2011/0031630 A1* | 2/2011 | Hashimoto ............ H10B 43/20 257/E21.585 |

(Continued)

FOREIGN PATENT DOCUMENTS

| | | |
|---|---|---|
| JP | 2011-166061 A | 8/2011 |
| JP | 2017-135238 A | 8/2017 |

(Continued)

*Primary Examiner* — Sarah K Salerno
(74) *Attorney, Agent, or Firm* — Oblon, McClelland, Maier & Neustadt, L.L.P.

(57) ABSTRACT

A semiconductor storage device according to one embodiment includes a stacked body, a pillar, a contact, and a region. In the stacked body, a plurality of electrically conductive layers and a plurality of insulating layers are stacked alternately one on another. The stacked body includes a stair portion in which end portions of the plurality of electrically conductive layers are stair-shaped. The contact is arranged in the stair portion, and connected at a side surface thereof to an nth (where n is an integer of 2 or larger) electrically conductive layer from the lowermost electrically conductive layer. The region is buried within an (n−1)th electrically conductive layer from the lowermost electrically conductive layer. The region includes an electrically conductive member located below the contact, and an insulating member surrounding the electrically conductive member, so that the region is electrically isolated from the (n−1)th electrically conductive layer that surrounds the region.

16 Claims, 12 Drawing Sheets

(56) References Cited

U.S. PATENT DOCUMENTS

| | | | |
|---|---|---|---|
| 2011/0201167 A1 | 8/2011 | Satonaka et al. | |
| 2012/0306090 A1* | 12/2012 | Smith | H01L 27/11556 257/773 |
| 2014/0054535 A1* | 2/2014 | Chen | H10B 41/50 257/E47.001 |
| 2018/0277561 A1 | 9/2018 | Yamamoto | |
| 2018/0350879 A1* | 12/2018 | Sel | H01L 21/76831 |
| 2021/0257382 A1* | 8/2021 | Zhou | H01L 27/11565 |
| 2022/0093635 A1* | 3/2022 | Lee | H01L 23/5283 |

FOREIGN PATENT DOCUMENTS

| | | |
|---|---|---|
| JP | 2018-160608 A | 10/2018 |
| JP | 2018-163981 A | 10/2018 |

* cited by examiner

SEMICONDUCTOR STORAGE DEVICE AND MANUFACTURING METHOD OF THE SAME

CROSS-REFERENCE TO RELATED APPLICATIONS

This application is based upon and claims the benefit of priority from Japanese Patent Application No. 2020-047085, filed on Mar. 18, 2020; the entire contents of which are incorporated herein by reference.

FIELD

Embodiments with this disclosure relate to a semiconductor storage device and a manufacturing method of the semiconductor storage device.

BACKGROUND

Some three-dimensional non-volatile memories have plural electrically conductive layers stacked one above another with an insulating layer interposed between every two adjacent insulating layers. In such memories, end portions of the plural electrically conductive layers are formed into a shape of stairs, and plural contacts are arranged on corresponding terrace (or tread) portion of the stairs, for electrical connection with each electrically conductive layer.

BRIEF DESCRIPTION OF THE DRAWINGS

FIG. is a cross-sectional view schematically illustrating a configurational example of a semiconductor storage device according to the first embodiment.

DETAILED DESCRIPTION

Figure 1:
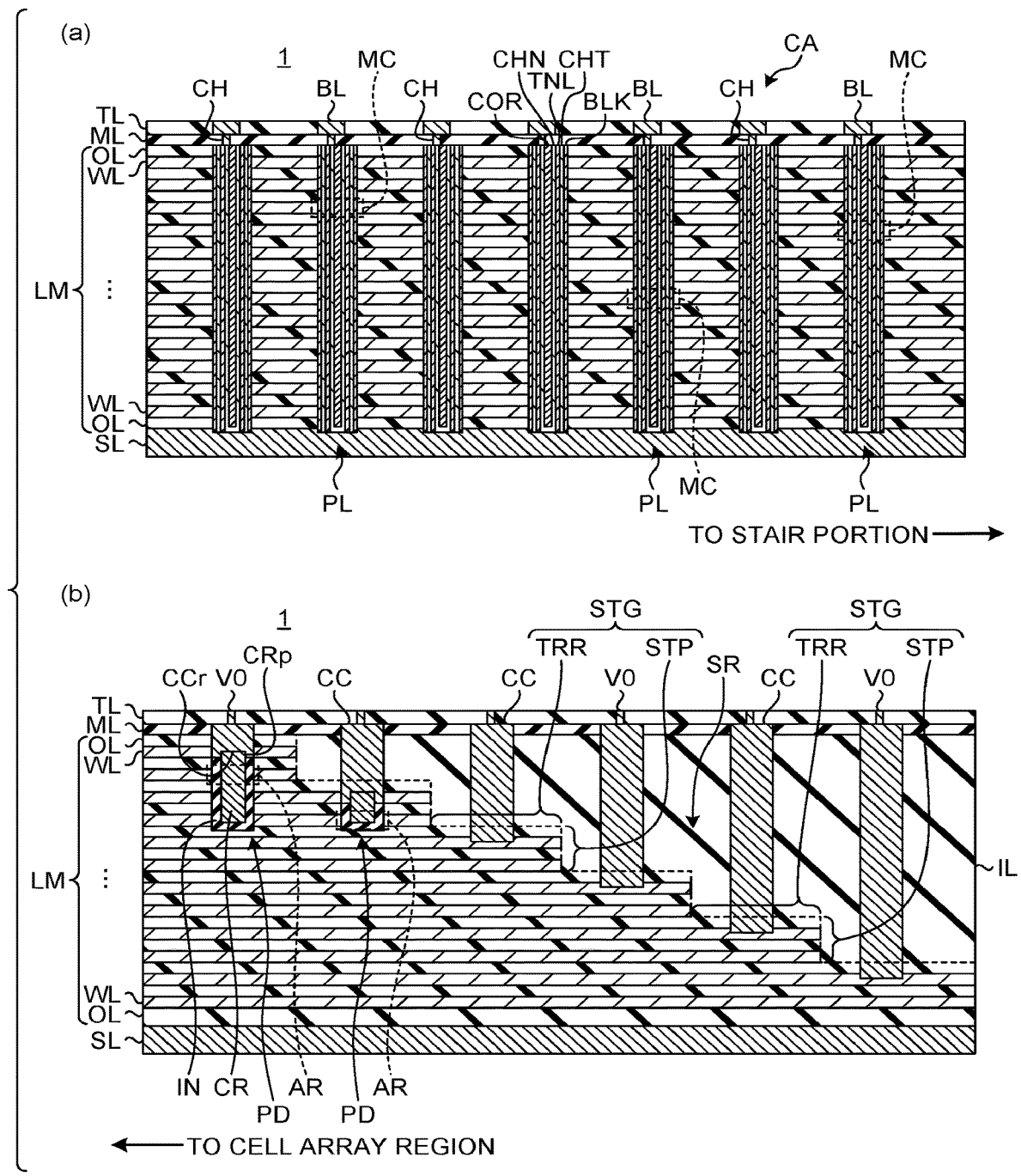

In some of three-dimensional non-volatile memories, for electrical connection with plural repeatedly stacked electrically conductive layers, end portions of the electrically conductive layers are formed into a shape of stairs, and plural contacts are arranged on corresponding terrace (or tread) portions of the stairs. In this case, the contacts may penetrate the corresponding terrace portions of the electrically conductive layer to be connected, which may lead to short circuits with a terrace portion of a lower electrically conductive layer, which may be one-layer below the electrically conductive layer to be connected.

Embodiments of this disclosure provide a semiconductor storage device and a manufacturing method of the semiconductor storage device.

A semiconductor storage device according to one embodiment includes a stacked body, a pillar, a contact, and a region. In the stacked body, a plurality of electrically conductive layers and a plurality of insulating layers are stacked alternately one on another. The stacked body includes a stair portion in which end portions of the plurality of electrically conductive layers are stair-shaped. The pillar penetrates through the stacked body, and includes memory cells in positions where the plurality of electrically conductive layers are in contact with the pillar. The contact is arranged in the stair portion, and connected at a side surface thereof to an nth (where n is an integer of 2 or larger) electrically conductive layer from the lowermost electrically conductive layer among the plurality of electrically conductive layers. The region is buried within an (n−1)th electrically conductive layer from the lowermost electrically conductive layer among the plurality of electrically conductive layers. The region includes an electrically conductive member located below the contact, and an insulating member surrounding the electrically conductive member, so that the region is electrically isolated from the (n−1)th electrically conductive layer that surrounds the region.

With reference to the accompanying drawings, embodiments of the present disclosure will now be described. In the drawings, the same or corresponding reference marks are given to the same or corresponding members or components, and redundant explanations will be omitted. It is to be noted that the following embodiments are not intended to limit the scope of the disclosure. Additionally, constitutional elements in the following embodiments may include those readily conceived by a skilled in the art and equivalents thereof.

First Embodiment

In the following, explanation is made on a first embodiment with reference to the drawings.

Configurational Example of Semiconductor Storage Device

FIG. 1 is a cross-sectional view schematically illustrating a configurational example of a semiconductor storage device 1 according to the first embodiment. Here, upward and downward directions in the semiconductor storage device 1 according to the first embodiment are defined in accordance with a shape of stair portion SR described later. Specifically, a direction to which terrace (or tread) portions TRR of the stair portion SR, namely, exposed surfaces of insulating layers OL in each step of the stair portion SR, are directed is defined as an upward direction of the semiconductor storage device 1.

As illustrated in FIG. 1, the semiconductor storage device 1 includes a source line SL. The source line SL corresponds to an upper part of a semiconductor substrate such as a silicon wafer. The upper part is provided with an n-well that includes a p-well, and thus functions as the source line SL. Incidentally, the source line SL may be separately provided above the semiconductor substrate. In this case, the source line SL may be formed of a material such as poly-silicon.

A stacked body LM is arranged on the source line SL. In the stacked body LM, plural word lines WL, serving as electrically conductive layers, and plural insulating layers OL are stacked alternately one on the other. The word lines WL are formed of an electrically conductive material such as tungsten or molybdenum; and the insulating layers OL are formed of an insulating material such as silicon oxide (SiO$_2$). The number of the word lines WL may be arbitrarily determined. Each one of the insulating layers OL is interposed between every two adjacent word lines WL among the word lines WL of which number is arbitrarily determined.

As illustrated in Part (a) of FIG. 1, the stacked body LM has in substantially the center thereof a cell array region CA in which plural pillars PL are arranged. Each pillar PL penetrates through the stacked body LM in a stacking direction of the stacked body LM and reaches the source line SL. The pillar PL has in its inside a block insulating layer BLK, an electric charge accumulation layer CHT, a tunnel insulating layer TNL, and a channel layer CHN that are arranged in this order along a direction from an outer wall to the center of the pillar PL. The channel layer CHN serves also as a bottom surface of the pillar PL, and is in contact with the source line SL. Incidentally, an inside of the channel layer CHN of the pillar PL is filled with a core layer COR.

The block insulating layer BLK, the tunnel insulating layer TNL, and the core layer COR are formed of, for example, SiO$_2$ and the like. The electric charge accumulation layer CHT is formed of, for example, silicon nitride (SiN) and the like. The channel layer CHN is formed of, for example, amorphous silicon or poly-silicon.

An insulating layer ML having contacts CH is arranged on the stacked body LM. An insulating layer TL having bit lines BL is arranged on the insulating layer ML. The contacts CH penetrate through the insulating layer ML, and connect the channel layers CHN of the pillars PL and the corresponding bit lines BL of the insulating layer TL.

As constructed in such a manner, in intersecting positions of the word lines WL and each of the pillar PL, memory cells MC are formed at corresponding levels of the word lines WL. Electric charge is accumulated to the electric charge accumulation layer CHT of the memory cell MC by applying a predetermined voltage thereto through the word lines WL, and thus data is written thereto in a non-volatile manner. Alternatively, the date stored by the memory cell MC is read out to the bit line BL by applying a predetermined voltage thereto through the word line WL.

However, several of the word lines WL, which include the uppermost or the lowermost word line WL in the stacked body LM, may function as selective gate lines. In intersecting positions of the selective gate lines and the pillars PL, selective gates are formed instead of the memory cells MC. When a particular one of the selective gates turns on and off, the memory cells MC in the pillar PL to which the selective gate belongs are in a selective state and in a non-selective state, respectively.

As illustrated in Part (b) of FIG. 1, the stacked body LM has a stair portion SR in a vicinity of peripheral area thereof. In the stair portion SR, end portions of the plural word lines WL are terminated into a stair shape. Each step STG of the stair portion SR has a step (riser) portion STP and a terrace (tread) portion TRR. The step portion STP is formed from end portions of the two terminated word lines WL and the insulating layers OL on the respective ones of the two word lines WL. The upper insulating layer OL of the insulating layers OL that belong to the same step STG is exposed on the terrace portion TRR.

The closer to the cell array region CA the steps STG of the stair portion SR are, the higher the steps STG are arranged. In the cross-section illustrated in Part (b) of FIG. 1, an even-numbered word line WL from the lowermost word line WL is located above the odd-numbered word line WL in each step STG. On the other hand, in another cross-section, as explained later referring to FIG. 2, an odd-numbered word line WL from the lowermost word line WL is located above the even-numbered word line WL within each step STG. With this, each one of the word lines WL become connectable with contact CC as described below.

The contacts CC are arranged on the corresponding terrace portions TRR of the steps STG of the stair portion SR. The contacts CC are formed of, for example, a metal such as tungsten. The stair portion SR is covered to the same level as an upper surface of the stacked body LM by an inter-layer insulating layer IL. The contacts CC penetrate through the above-described insulating layer MT, the inter-layer insulating layer IL, and the insulating layer OL of which upper surface is exposed in each step STG, and thus are connected to the word line WL below the insulating layer OL.

On the inter-layer insulating layer IL, the above-described insulating layer ML and the insulating layer TL having contacts V0 are arranged in this order. The contacts V0 that penetrate the insulating layer TL connect the contacts CC and an upper connection line or the like (not illustrated).

Below the contacts CC connected to the word lines WL on the upper side, including the contact CC connected to the uppermost word line WL, pedestals PD are arranged in positions overlapped in planer view with positions in which the corresponding contacts CC are arranged.

An upper end portion of the pedestal PD is arranged within the word line WL to which the contact CC provided with the pedestal PD is connected. Namely, the upper end portion of the pedestal PD is higher than a lower surface and lower than an upper surface of the word line WL concerned. A lower end portion of the pedestal PD reaches a position deep enough to allow the pedestal PD to penetrate the word line WL that is at least one-layer below the word line WL that is the lowest among the word lines WL to which the contacts CC having the pedestal PD are connected.

In an example of Part (b) of FIG. 1, two pedestals PD are provided: one is arranged below the contact CC connected to the uppermost word line WL, and the other is arranged below the contact CC connected to the word line WL that is two-layer below the uppermost word line WL. The upper end portion of the former pedestal PD is arranged within the uppermost word line WL; and an upper end portion of the latter pedestal PD is arranged within the word line WL that is two-layer below the uppermost word line WL. The lower end portions of these two pedestals PD reach a position deep enough to allow the pedestals PD penetrate the word line WL, which is one more layer below the word line WL that is two-layer below the uppermost word line WL, namely, the word line WL that is three-layer below the uppermost word line WL.

However, the lower end portions of these pedestals PD may reach further deeper positions. For example, the pedestal PD may penetrate through the stacked body LM and thus reach the source line SL.

The pedestals PD each has an insulating member IN formed of, for example, $SiO_2$ and the like, and an electrically conductive member CR formed of, for example, amorphous silicon and the like. However, the electrically conductive member CR may be formed of poly-silicon. The insulating member IN is arranged thin on an inner wall surface and a bottom surface of the pedestal PD. Therefore, the insulating member IN has a shape of bottomed cylinder. The electrically conductive member CR is filled inside the insulating member IN.

With this, the word line WL through which the pedestal PD penetrates, for example, has an insulating region AR. The insulating region AR is a region occupied by the pedestal PD in the word line WL. In other words, the insulating region AR is a region defined by the insulating member IN that surrounds the electrically conductive member CR. By being surrounded by the insulating member IN, the electrically conductive member CR is insulated from the word line WL that surrounds the periphery of the insulating region AR.

An outer wall of the insulating member IN that constitutes the sidewall of the pedestal PD is continuous with the sidewall of the contact CC. Namely, a diameter of a bottom portion of the contact CC that is in contact with the pedestal PD equals substantially to a diameter of an upper part of the pedestal PD that is in contact with the contact CC, and the sidewall of the contact CC is formed substantially integrally with the sidewall of the pedestal PD.

An upper end portion of the electrically conductive member CR arranged in the center portion of the pedestal PD has a protrusion portion CRp that protrudes from an upper end portion of the insulating member IN arranged in an outer peripheral portion of the pedestal PD, for example. On the other hand, the contact CC has a recess portion CCr in the center portion of a bottom surface thereof, for example. The protrusion portion CRp of the electrically conductive member CR of the pedestal PD is fitted into the recess portion CCr of the contact CC, and thus the upper end portion of the electrically conductive member CR is connected to the lower end portion of the contact CC. Namely, the word line WL is not interposed between the contact CC and the electrically conductive member CR of the pedestal PD, for example.

Figure 2:
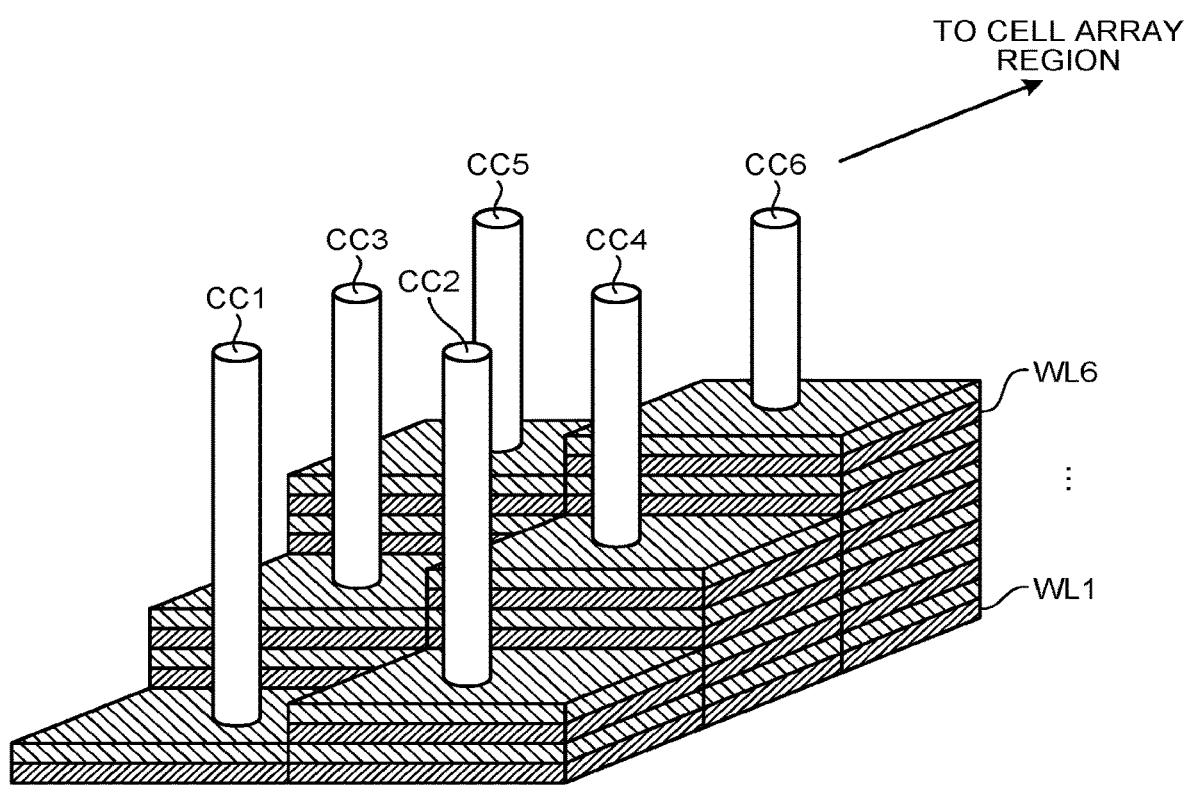
FIG. 2 is a perspective view schematically illustrating a configurational example of the stair portion of the semiconductor storage device according to the first embodiment.

FIG. 2 is a perspective view schematically illustrating a configurational example of the stair portion SR of the semiconductor storage device 1 according to the first embodiment.

As illustrated in FIG. 2, the stair portion SR of the semiconductor storage device 1 is divided into two rows in a direction perpendicular to a direction directed to the cell array region CA. Namely, the stair portion SR has two rows of stairs that are ascending toward an upper end portion of the cell array region CA.

Steps of one of the two rows of stairs arranged side-by-side in the direction perpendicular to the direction directed to the cell array region CA are raised by one-step, namely, by a height corresponding to one word line WL and one insulating layer OL, compared with the corresponding steps of the other one of the two rows of stairs. Additionally, the steps in the two rows, the steps being closer to the cell array region CA, are arranged higher by a height of the two word lines WL and the two insulating layers OL. Because the stairs are constructed in such a manner, the word lines WL become connectable by the corresponding contacts CC (CC1 to CC6, in the illustrated example) in the end portion of the stacked body LM.

Although not illustrated in FIG. 1 or FIG. 2, the semiconductor storage device 1 is provided with a peripheral circuit that contributes to operations of the memory cells MC. The peripheral circuit includes transistors (not illustrated) on the semiconductor substrate. When the above-described source line SL is formed in the semiconductor substrate, the peripheral circuit is arranged outside and laterally to the stacked body LM. When the source line SL is separately provided above the semiconductor substrate, the peripheral circuit is arranged in a vicinity of the semiconductor substrate below the stacked body LM.

Manufacturing Method of Semiconductor Storage Device

Next, referring to FIGS. 3 through 7, explanation is made on a manufacturing method of the semiconductor storage device 1 according to the first embodiment. FIGS. 3 through 7 are cross-sectional views schematically illustrating examples of processing steps of the manufacturing method of the semiconductor storage device 1 according to the first embodiment.

In the following, processing steps of the pillar PL and the stair portion SR are explained in sequence. First, the manufacturing steps of the pillar PL are explained.

Figure 3:
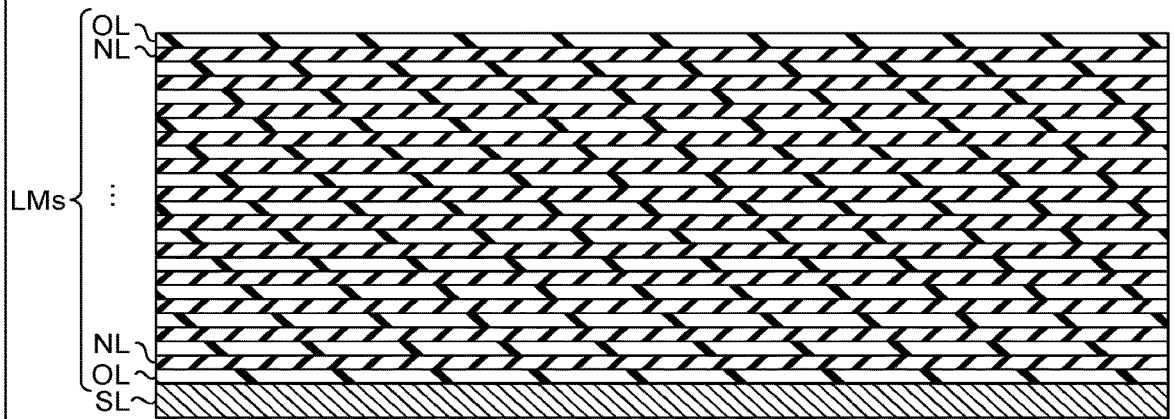
FIG. 3 is cross-sectional views schematically illustrating examples of processing steps of the manufacturing method of the semiconductor storage device according to the first embodiment.
Figure 3:
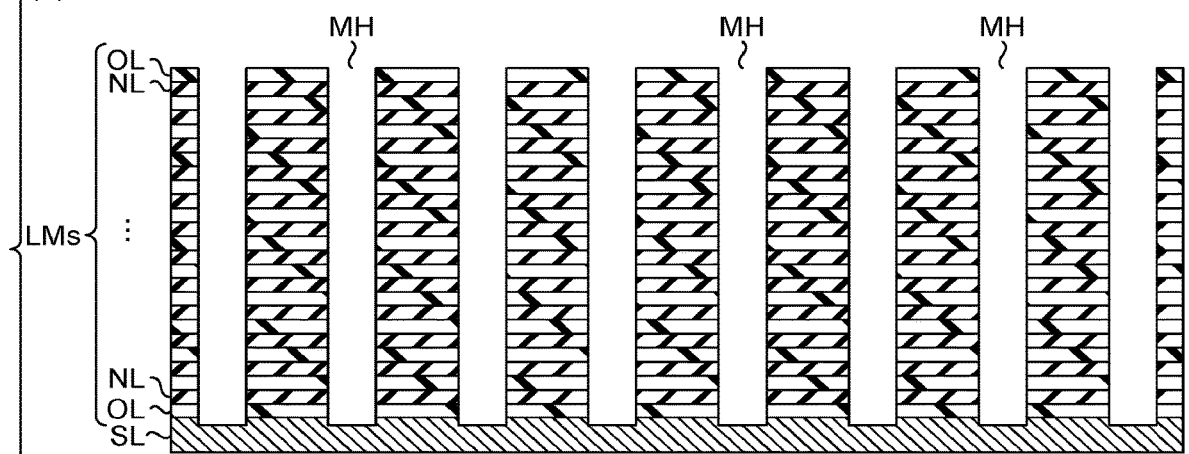
Figure 3:
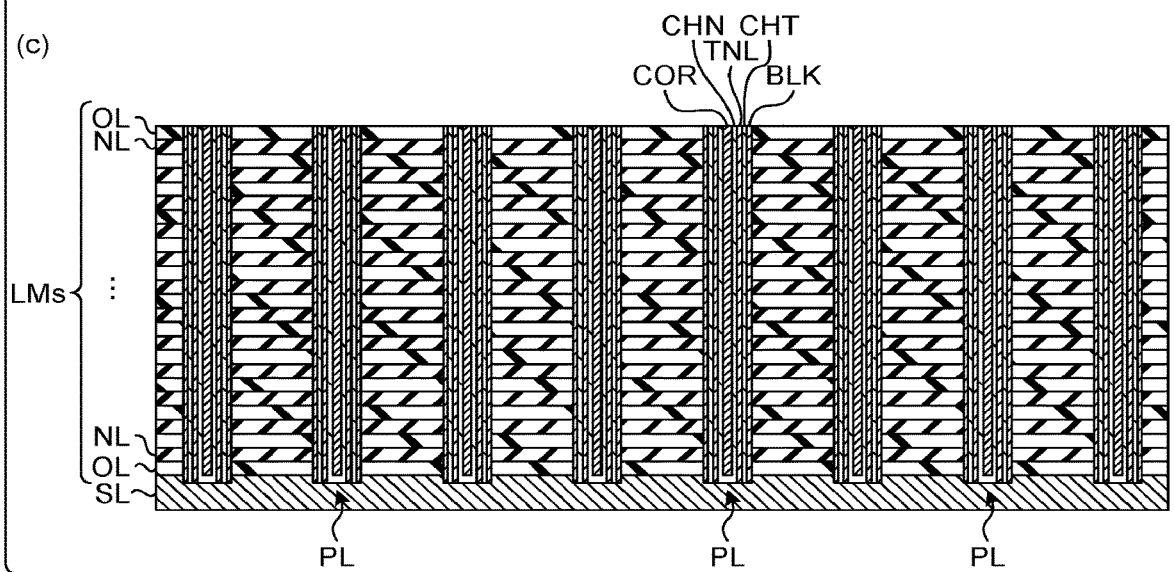

As illustrated in Part (a) of FIG. 3, a stacked body LMs is formed on the source line SL. In the stacked body LMs, plural sacrificial layers NL serving as second insulating layers and plural insulating layers OL serving as first insulating layers are stacked alternately one on the other. The sacrificial layers NL are to be turned into the word lines WL by a replacement process described later. The sacrificial layers NL are formed of SiN or the like, which is replaceable with an electrically conductive material such as tungsten or the like.

As illustrated in Part (b) of FIG. 3, plural memory holes MH are formed which penetrate through the stacked body LMs and reach the source line SL.

As illustrated in Part (c) of FIG. 3, the block insulating layer BLK, the electric charge accumulation layer CHT, the tunnel insulating layer TNL, the channel layer CHN, and the core layer COR are formed within each of the memory holes MH in this order along a direction from the inner wall to the center of the memory holes MH. The channel layer CHN is formed also on the bottom surface of the memory hole MH. With this, plural pillars PL are formed.

Next, the processing steps of the stair portion SR are explained.

Figure 4:
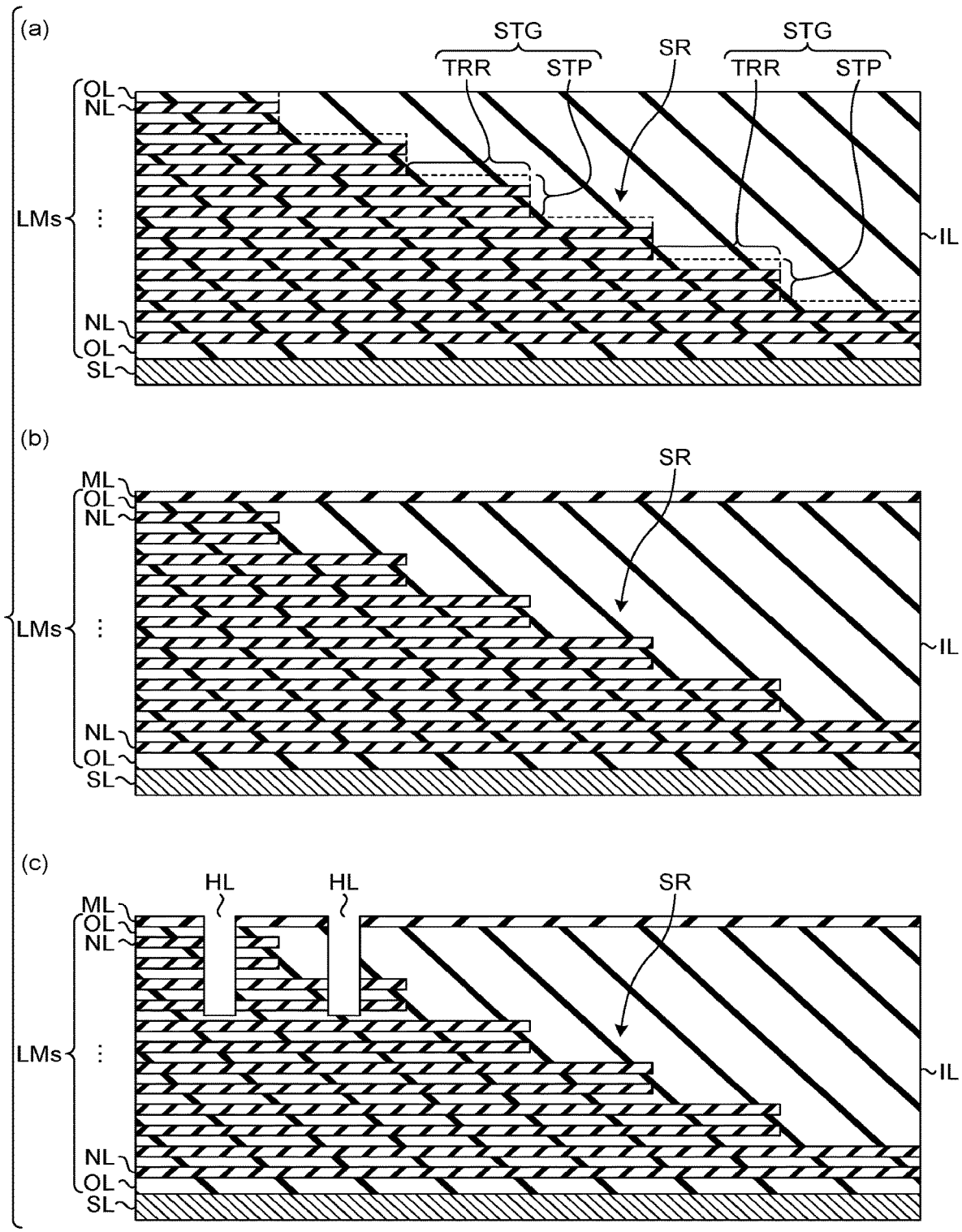
FIG. 4 is cross-sectional views schematically illustrating examples of processing steps of the manufacturing method of the semiconductor storage device according to the first embodiment.

As illustrated in Part (a) of FIG. 4, the end portion of the stacked body LMs, the end portion extending to a region that is turned to be the stair portion SR, is processed into a shape of stairs, and thus the stair portion SR is obtained. The stair portion SR is covered by the inter-layer insulating layer IL serving as a third insulating layer up to a level corresponding to the upper surface of the stacked body LMs, for example.

The above-described process of forming the stair portion SR may employ, for example, a slimming technique of a resist pattern, which is described later. Namely, a resist pattern formed on the end portion of the stacked body LMs is slimmed so that an edge portion of the resist pattern is retreated, and then a predetermined number of the layers in the stacked body LMs are removed using the resist pattern as a mask. Such slimming of the resist pattern and removing the layers are repeated, and thus the stair portion SR is obtained which has plural steps STG including the step portions STP and the terrace portions TRR.

At this time, the uppermost insulating layer OL and the sacrificial layer NL below the uppermost insulating layer OL are removed in advance for one of the two rows of stairs. With this, the two rows of stairs can be formed. Namely, steps in one of the two rows of stairs are lower by a total thickness of the insulating layer OL and the sacrificial layer NL, which is turned to be the word line WL, than the corresponding steps in the other one of the two rows of stairs.

Incidentally, the process illustrated in FIG. 3 and the process illustrated in Part (a) of FIG. 4 are replaceable in terms of process order.

As illustrated in Part (b) of FIG. 4, the insulating layer ML is formed on the inter-layer insulating layer IL. Here, the insulating layer ML is formed also on the stacked body LMs of the cell array region CA.

As illustrated in Part (c) of FIG. 4, holes HL are formed in positions corresponding to the uppermost step and the second uppermost step. These holes HL penetrate through the insulating layer ML, the inter-layer insulating layer IL, and the plural sacrificial layers NL including the sacrificial layer NL located at a predetermined depth in the stacked body LMs. Namely, two holes HL are formed: one penetrates the first through fourth uppermost sacrificial layers NL in the uppermost step, and the other penetrates through the third and fourth uppermost sacrificial layers NL in the second uppermost step.

Figure 5:
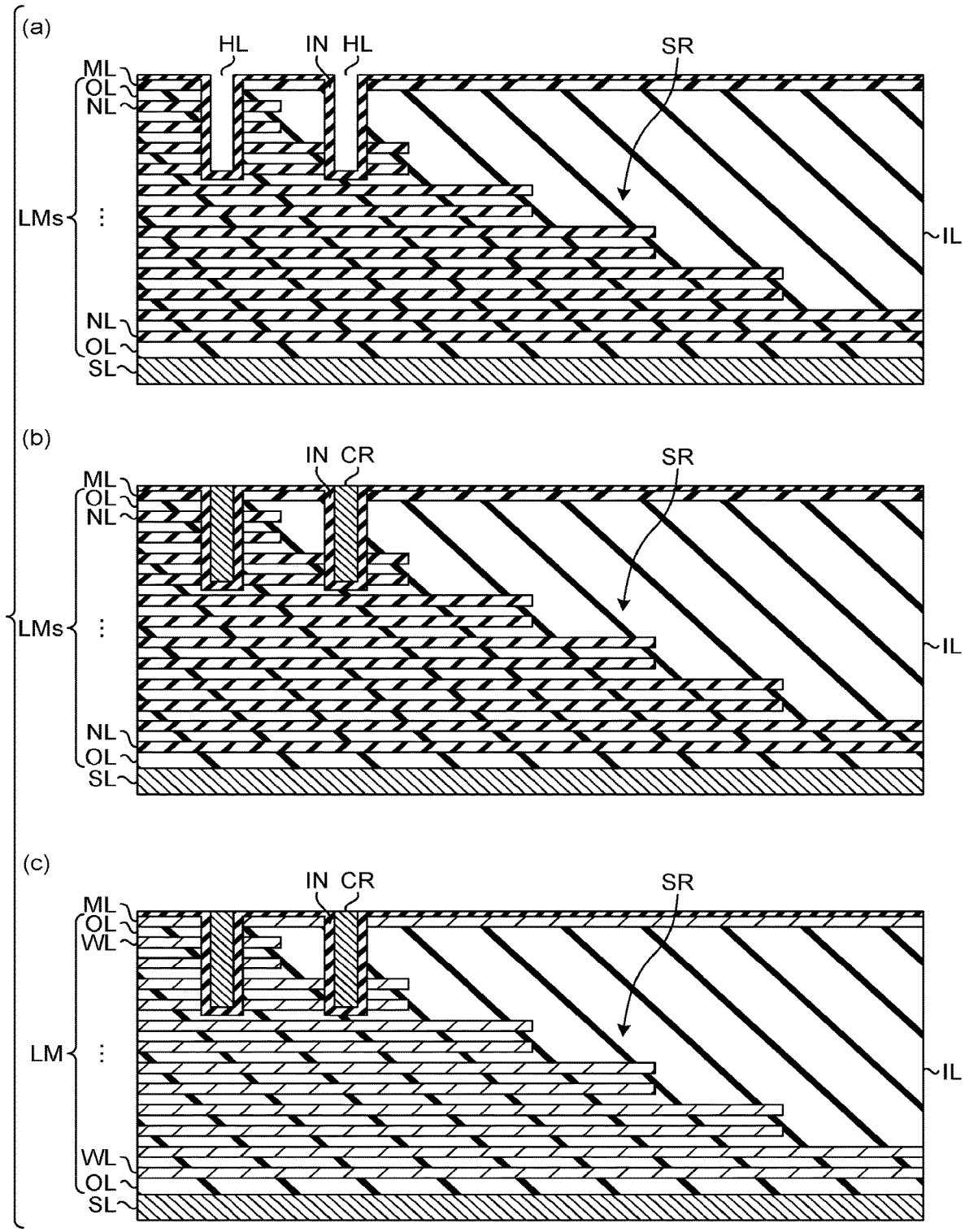
FIG. 5 is cross-sectional views schematically illustrating examples of processing steps of the manufacturing method of the semiconductor storage device according to the first embodiment.

As illustrated in Part (a) of FIG. 5, the insulating member IN is formed to cover the insulating layer ML. At this time, the insulating member IN is also formed on the sidewall and the bottom surface of the holes HL. Here, the insulating member IN is formed to be not too thick, in order that the holes HL are not filled with the insulating member IN.

As illustrated in Part (b) of FIG. 5, the electrically conductive member CR serving as the first electrically conductive member is formed to cover the insulating member IN on the sidewall and the bottom surface of the hole HL. Here, the electrically conductive member CR is formed so thick that the inside of the hole HL is filled with the electrically conductive member CR. The electrically conductive member CR that covers the insulating member IN on the insulating layer ML is removed.

As illustrated in Part (c) of FIG. 5, each one of the sacrificial layers NL between the insulating layers OL is removed, and then an electrically conductive material such as tungsten is filled into spaces between the insulating layers OL. With this, the word lines WL are formed. Removing the sacrificial layers NL and filling the electrically conductive material are performed through slits (not illustrated). The slits are formed as grooves that penetrate through the stacked body LMs and extend from the cell array region CA to the stair region SR. Namely, the slits are formed in parallel with the cross section illustrated in Part (c) of FIG. 5.

With this, the sacrificial layers NL extending from the cell array region CA to the stair region SR are replaced with the word lines WL. The sacrificial layers NL in the stacked body LMs are wholly replaced with the word lines WL, and thus the stacked body LM is formed in which the words lines WL and the insulating layers OL are stacked alternately one on the other.

Incidentally, such a process where the sacrificial layers NL are replaced with the electrically conductive material to form the word lines WL may be referred to as replacement.

Figure 6:
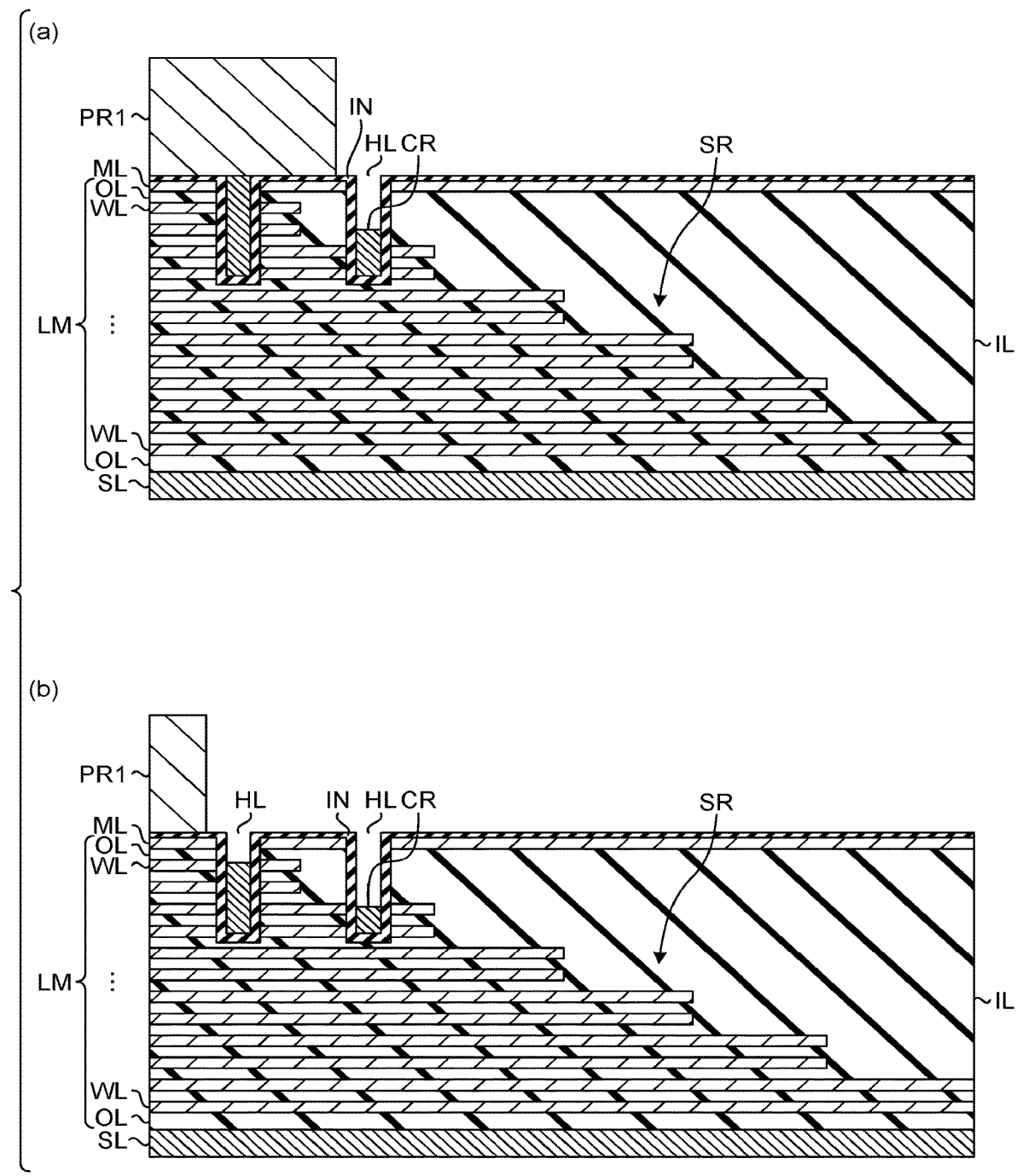
FIG. 6 is cross-sectional views schematically illustrating examples of processing steps of the manufacturing method of the semiconductor storage device according to the first embodiment.

As illustrated in Part (a) of FIG. 6, a resist pattern PR1 is formed on the insulating member IN on the insulating layer ML of the stair portion SR. From an edge portion of the resist pattern PR, the hole HL formed with respect to the step one-step below the uppermost step (the second uppermost step) of the stair portion SR, among the two holes HL, is exposed. Then, the electrically conductive member CR that has been filled into the exposed hole HL is etched back to a predetermined depth.

As illustrated in Part (b) of FIG. 6, the resist pattern PR1 is slimmed by O2 plasma or the like, and thus an edge of the resist pattern PR1 is retreated. With this, the other hole HL, namely, the hole HL formed with respect to the uppermost step of the stair portion SR is also exposed.

Then, the electrically conductive member CR that has been filled into the hole HL formed with respect to the uppermost step is etched back to a predetermined depth. At this time, the electrically conductive member CR that has been filled into the hole HL that has been formed with respect to the second uppermost step and already exposed is etched back to a further deeper position.

With this, an upper end of the electrically conductive member CR comes to be located between an upper surface and a lower surface of the uppermost word line WL in the hole HL formed with respect to the uppermost step. Additionally, in the hole HL that has been formed with respect to the second uppermost step and previously exposed, the upper end portion of the electrically conductive member CR is located between an upper surface and a lower surface of the second uppermost word line WL.

In other words, the electrically conductive members CR are etched back so that the upper portions thereof are located as described above.

Incidentally, the electrically conductive members CR for one of the two rows of stairs are etched back to a predetermined depth in advance. With this, the electrically conductive members CR in the holes HL of the one of the two rows of stairs are lower by a total thickness of one sacrificial layer NL and one insulating layer OL with respect to those in the holes of the other of the two rows of stairs.

Figure 7:
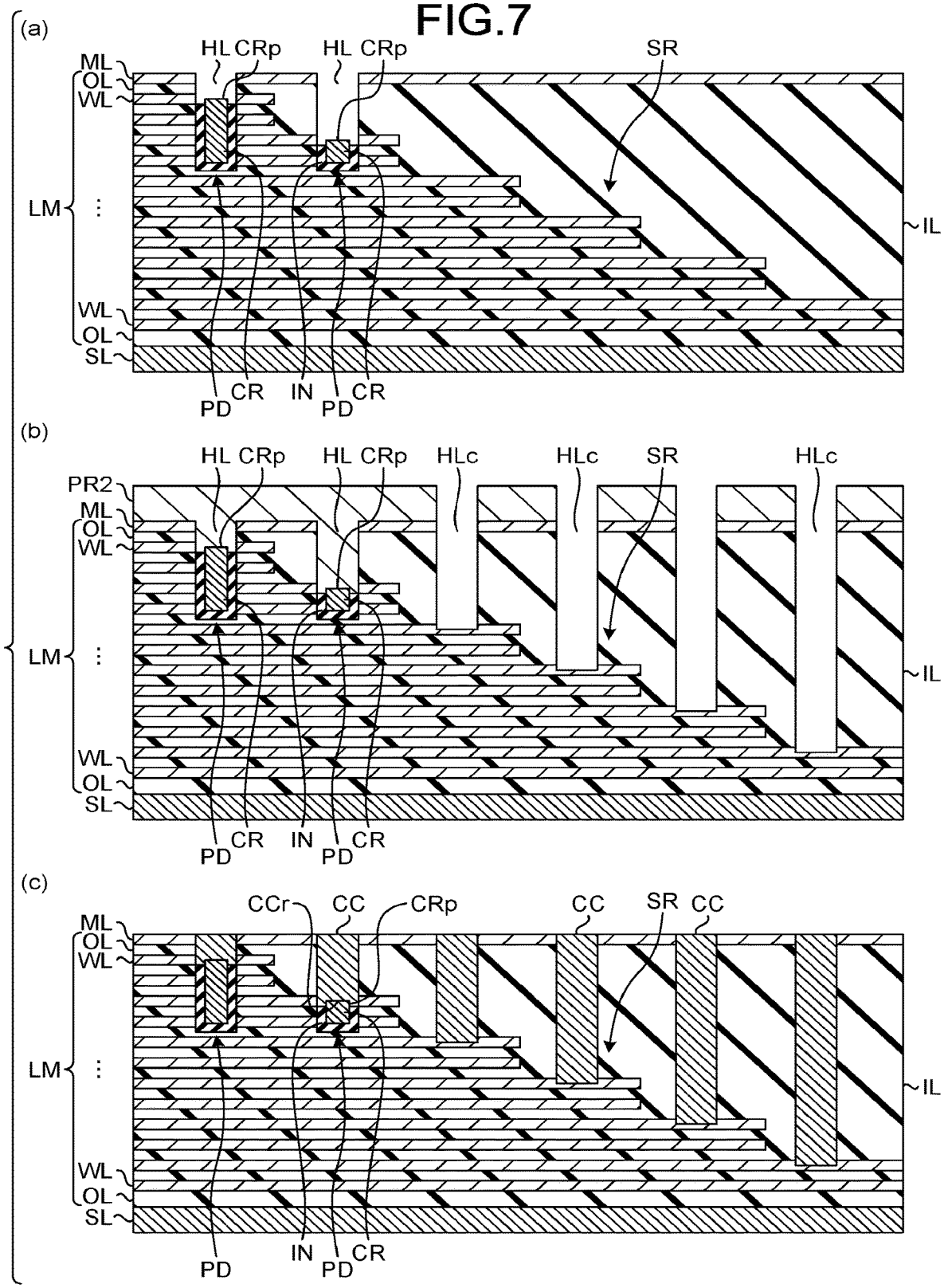
FIG. 7 is cross-sectional views schematically illustrating examples of processing steps of the manufacturing method of the semiconductor storage device according to the first embodiment.

As illustrated in Part (a) of FIG. 7, the insulating member IN on the side surface of the two holes HL are removed to a predetermined depth by a wet-etching method or the like. With this, a side surface of the uppermost word line WL within each of the two holes HL is exposed on the inner surface of the corresponding holes HL.

Namely, within the hole HL formed with respect to the uppermost step, the side surface of the uppermost word line WL is exposed. At this time, by removing the insulating member IN on the side surface of the hole HL down to a level lower than the upper end portion of the electrically conductive member CR remaining within the same hole HL, a protrusion portion CRp may be formed. Namely, the upper end portion of the electrically conductive member CR may protrude from the upper end portion of the insulating member IN. However, the upper end portion of the insulating member IN on the side surface of the hole HL is located higher than the upper surface of the word line WL that is one-layer below the uppermost word line WL.

Additionally, in the hole HL formed with respect to the second uppermost step (i.e., the step that is one-step below the uppermost step), a side surface of the word line WL that is two-layer below the uppermost word line WL in the stair portion SR is exposed. At this time, by removing the insulating member IN on the side surface of the hole HL down to a level lower than the upper end portion of the electrically conductive member CR remaining within the same hole HL, a protrusion portion CRp may be formed. Namely, the upper end portion of the electrically conductive member CR may protrude from the upper end portion of the insulating member IN. However, the upper end portion of the insulating member IN on the side surface of the hole HL is located higher than the upper surface of the word line WL that is one-layer below the word line WL that is two-layer below the uppermost word line WL (i.e., the fourth uppermost word line WL).

With all these processes, the pedestal PD is formed in each of the two holes HL. Here, the insulating member IN on the upper surface of the insulating layer ML is also removed.

As illustrated in Part (b) of FIG. 7, a resist pattern PR2 is formed on the insulating layer ML. The resist pattern PR2 has openings in positions above the steps lower than the step that is one-step below the uppermost step (the second uppermost step). The two holes HL that have been formed with respect to the uppermost step and the second uppermost step are covered by the resist pattern PR2. Incidentally, because these holes HL are sufficiently shallow, the holes HL are filled fully with a resist material constituting the resist pattern PR2.

Then, plural contact holes HLc are formed using the resist pattern PR2 as a mask. The contact holes HLc penetrate through the insulating layer ML and reach the word lines WL in the respective steps. After this, the resist pattern PR2 is removed.

As illustrated in Part (c) of FIG. 7, electrically conductive material such as tungsten, serving as a second electrically conductive member, is filled into the two holes HL, which have once been filled with the resist material, and the plural contact holes HLc formed using the resist patter PR2 as the mask. The electrically conductive material deposited on the insulating layer ML is removed by a Chemical Mechanical Polishing (CMP) method or the like.

With this, the contacts CC are formed in corresponding ones of the two holes HL. These contacts CC are in contact at side surfaces thereof with the uppermost word line WL and the second uppermost word line WL, respectively, and have the pedestals PD arranged at the lower end portions thereof. Additionally, these contacts CC have at the end portions thereof recess portions CCr into which the protrusion portions CRp of the electrically conductive members CR of the pedestals PD are fitted, respectively.

Additionally, by filling the electrically conductive material, the contacts CC are formed also in the contact holes HLc. These contact holes HLc are connected with at least upper surfaces of the corresponding word lines WL.

Subsequently, the contacts CH (Part (a) of FIG. 1) are formed to penetrate through the insulating layer ML of the cell array region CA and to connect with the channel layers CHN of the pillars PL. Additionally, the insulating layer TL is formed on the insulating layer ML of the stair portion SR and the cell array region CA. Then, the bit lines BL are formed to connect the corresponding contacts CH on the insulating layer TL in the cell array region CA. The contacts V0 are formed to penetrate the insulating layer TL in the stair portion SR and connect the corresponding contacts CC. Further above the contacts V0, the upper connection lines or the like are formed to connect the contacts V0.

As stated above, the semiconductor storage device 1 according to the first embodiment is manufactured.

Comparative Example

Figure 8:
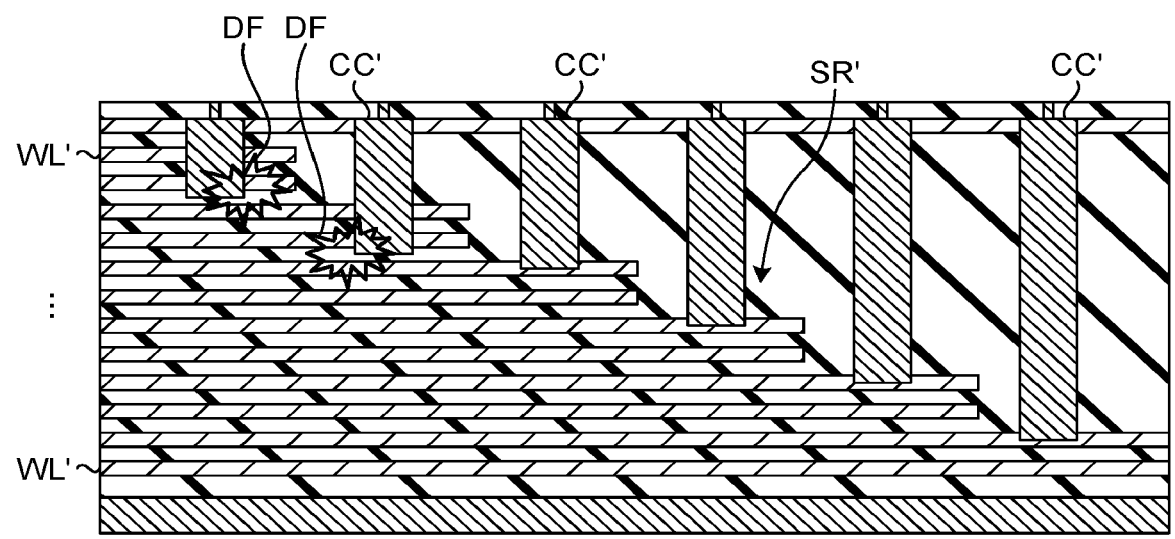
FIG. 8 is a cross-sectional view schematically illustrating a configurational example of a semiconductor storage device according to a comparative example.

FIG. 8 is a cross-sectional view schematically illustrating a configurational example of a semiconductor storage device according to a comparative example. In the semiconductor storage device according to this comparative example, all contact holes are formed at a time for contacts CC' to be connected with corresponding word lines WL'. In this case, the contact holes for the contacts CC' to be connected with the corresponding ones of the word lines WL' on the upper side may penetrate the word line WL' with which the contact CC' is to be connected, and thus reach the word line WL' one-layer below.

As illustrated in FIG. 8, when electrically conductive material is filled into such contact holes thereby to form the contacts CC', the word line WL' to be connected and the word line WL' one-layer below thereof become electrically conductive by the contact CC', and thus short circuit failures DF may occur.

According to the semiconductor storage device 1 of the first embodiment, the pedestals PD are provided below the contacts CC connected to the corresponding ones of the upper two word lines WL, including the uppermost word line WL. Such pedestals PD are formed within the holes HL having a predetermined depth, and insulate the contacts CC from the word line WL one-layer below the word lines WL that are in contact with the contacts CC. Then, the contacts CC are formed as explained above by filling the electrically conductive material into the holes HL in which only the word lines WL that are to be connected with the contacts CC are exposed.

As described above, because the contact CC is formed by filling the electrically conductive material above the pedestal PD that is insulated in advance from surroundings thereof, there is no need to form the contact hole HLc for the steps of the stair portion SR on the upper side. Additionally, the contact holes HL are prevented from penetrating through the corresponding word lines WL to be connected with the contacts CC. Therefore, the contacts CC are prevented from being short-circuited with the word line WL below the word line WL to be connected.

Additionally, such a configuration of the first embodiment where there is no need to form the contact holes HLc on the upper side may be more advantageous in terms of prevention of penetration through the word line WL to be connected and short circuits between the word lines WL, when the number of the word lines WL is increased.

According to the semiconductor storage device 1 of the first embodiment, the sidewall of the pedestal PD is continuous with the sidewall of the contact CC. In other words, the contact CC and the pedestal PD arranged below the contact CC are formed in a same hole HL. With this, the contact CC is prevented from being erroneously aligned with the pedestal PD.

Second Embodiment

In the following, explanation is made on a second embodiment with reference to drawings. A semiconductor storage device 2 according to the second embodiment is different from the semiconductor storage device 1 according to the first embodiment in that pedestals PDm are arranged below the contacts CC connected not only to the word lines WL on the upper side but also to the word lines WL on the lower side.

Configurational Example of Semiconductor Storage Device

Figure 9:
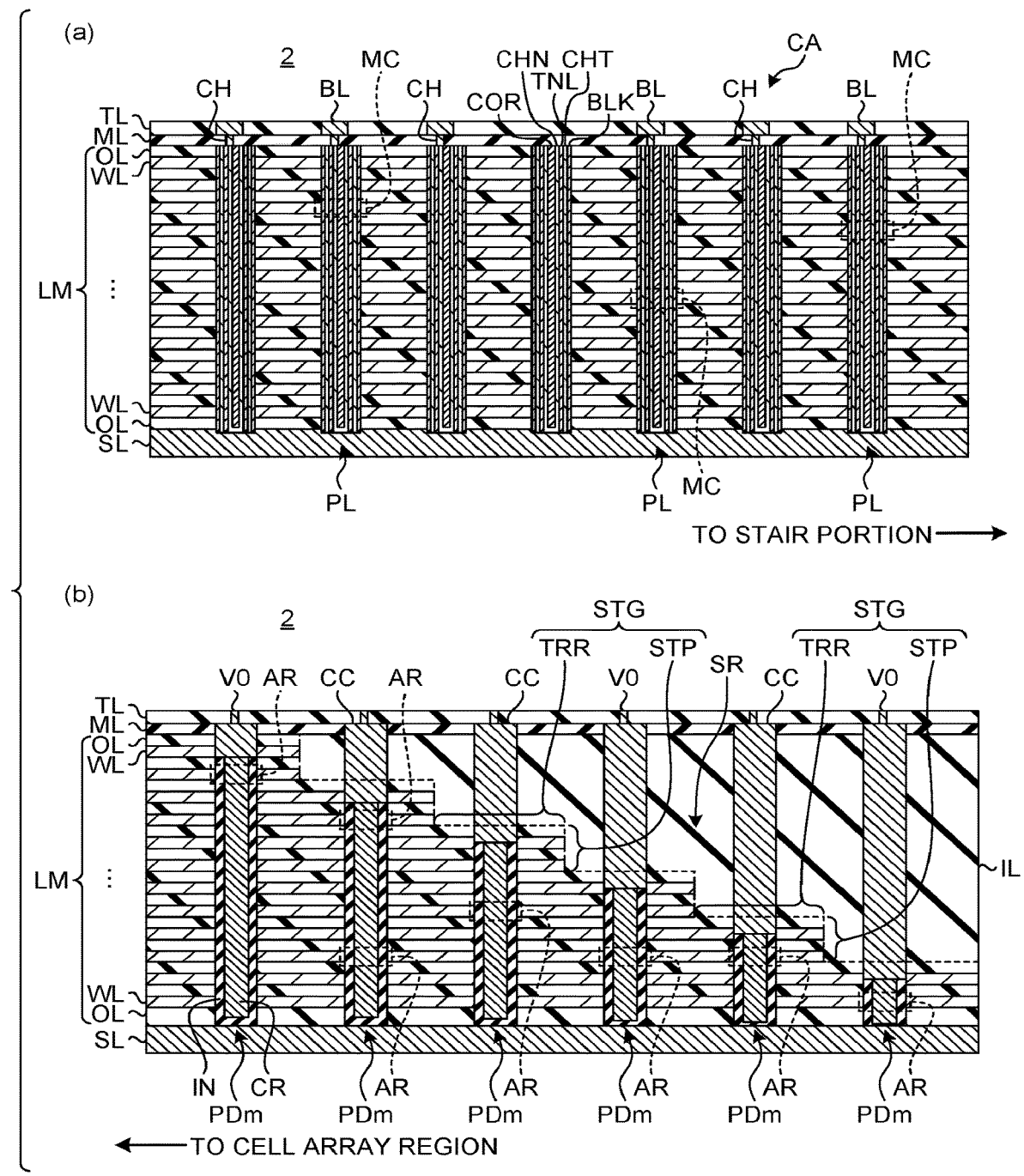
FIG. 9 is a cross-sectional view schematically illustrating a configurational example of a semiconductor storage device according to the second embodiment.

FIG. 9 is a cross-sectional view schematically illustrating a configurational example of the semiconductor storage device 2 according to the second embodiment. Here, regarding upward and downward directions in the semiconductor storage device 2 according to the second embodiment, a direction to which that terrace portions TRR of the stair portion SR are directed is defined as an upward direction.

As illustrated in Part (a) of FIG. 9, a cell array region CA is configured in the same manner as the cell array region CA of the above-described first embodiment.

As illustrated in Part (b) of FIG. 9, in the stair portion SR, the pedestals PDm are arranged below the corresponding contacts CC connected to steps STG. Namely, the pedestals PDm are arranged respectively below the contact CC connected to the uppermost word line WL through the contact CC connected to the second word line WL from the lowermost word line WL.

Upper end portions of the pedestals PDm are located at a same level of lower surfaces of the corresponding word lines WL to which the contacts CC provided with the pedestals PDm are connected, in this embodiment. Lower end portions of the pedestals PDm are located at least lower than the lowermost word line WL. Specifically, the pedestals PDm reach, for example, the source line SL.

An insulating member IN formed of, for example, $SiO_2$ or the like is arranged on an inner wall surface and a bottom surface, which is in contact with the source line SL, of each of the pedestals PDm. An electrically conductive member CR formed of, for example, amorphous silicon, poly-silicon, or the like is filled inside the insulating member IN.

With this, insulating regions AR insulated from the word line WL are provided to the word lines WL through which the pedestal PDm penetrates.

Here, a diameter of a bottom portion of the contact CC that is in contact with the pedestal PDm equals substantially to a diameter of an upper part of the pedestal PDm that is in contact with the contact CC. Namely, a sidewall of the contact CC and a sidewall of the pedestal PDm are substantially integrally formed.

A bottom surface of the contact CC is connected to an upper surface of the electrically conductive member CR of the pedestal PDm. Namely, the word line WL is not interposed between the contact CC and the electrically conductive member CR of the pedestal PDm.

Here, in an example of FIG. 9, the upper end portion of the electrically conductive member CR of the pedestal PDm is located at a substantially same level of the upper portion of the insulating member IN of the pedestal PDm. However, in some of the pedestals PDm below the contacts CC connected to the word lines WL on the upper side, among the plural pedestals PDm, the electrically conductive members CR may have protrusion portions, respectively; as is the case with the first embodiment (see Part (b) of FIG. 1). Alternatively, the electrically conductive members CR in all the pedestals PDm may have the protrusion portions. Incidentally, along with this, the lower end portions of the contacts CC may have recess portions, respectively, and thus the protrusion portions of the electrically conductive member CR may be fitted into the corresponding recess portions of the contacts CC.

Manufacturing Method of Semiconductor Storage Device

Figure 10:
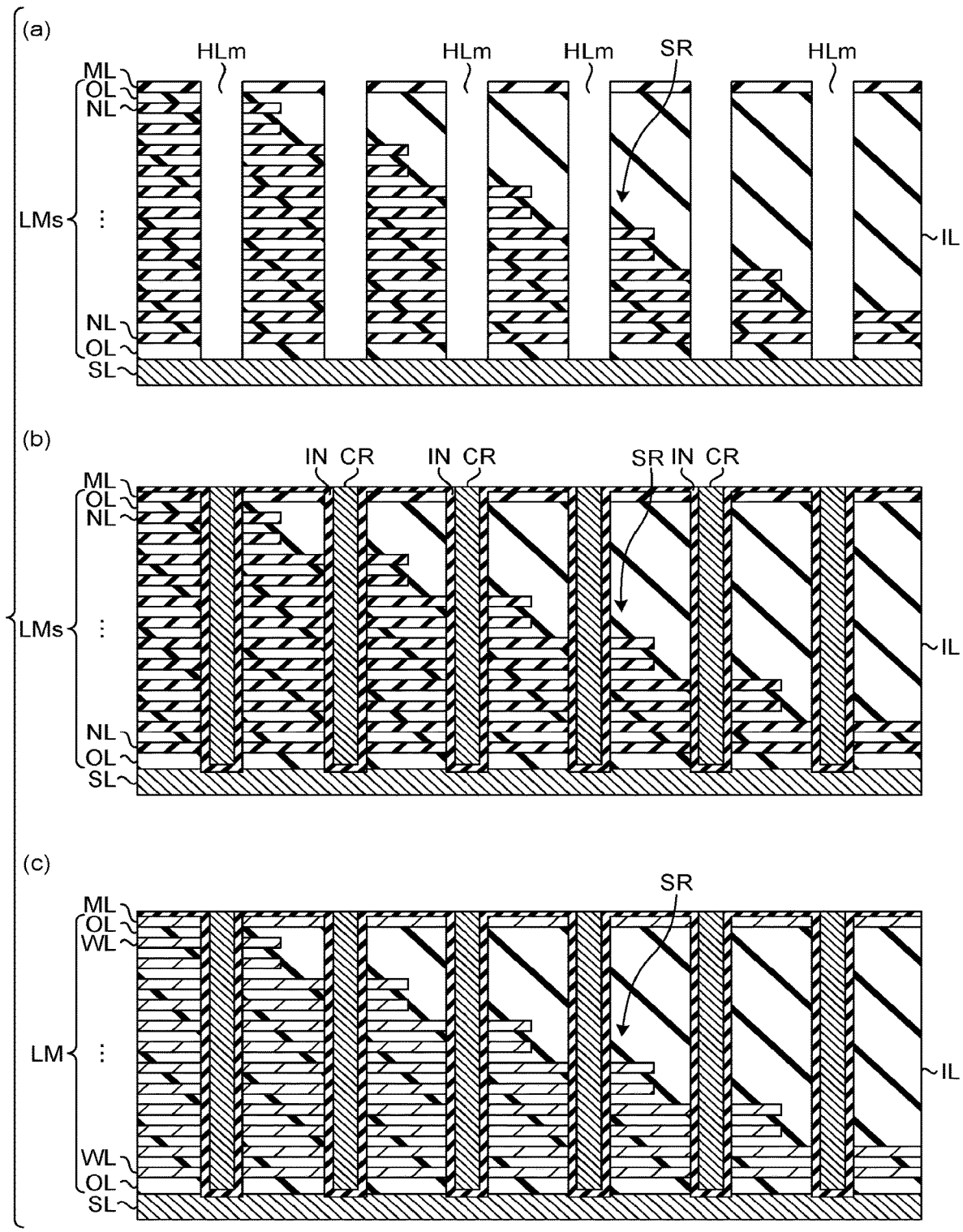
FIG. 10 is cross-sectional views schematically illustrating the manufacturing method of the semiconductor storage device according to the second embodiment.
Figure 11:
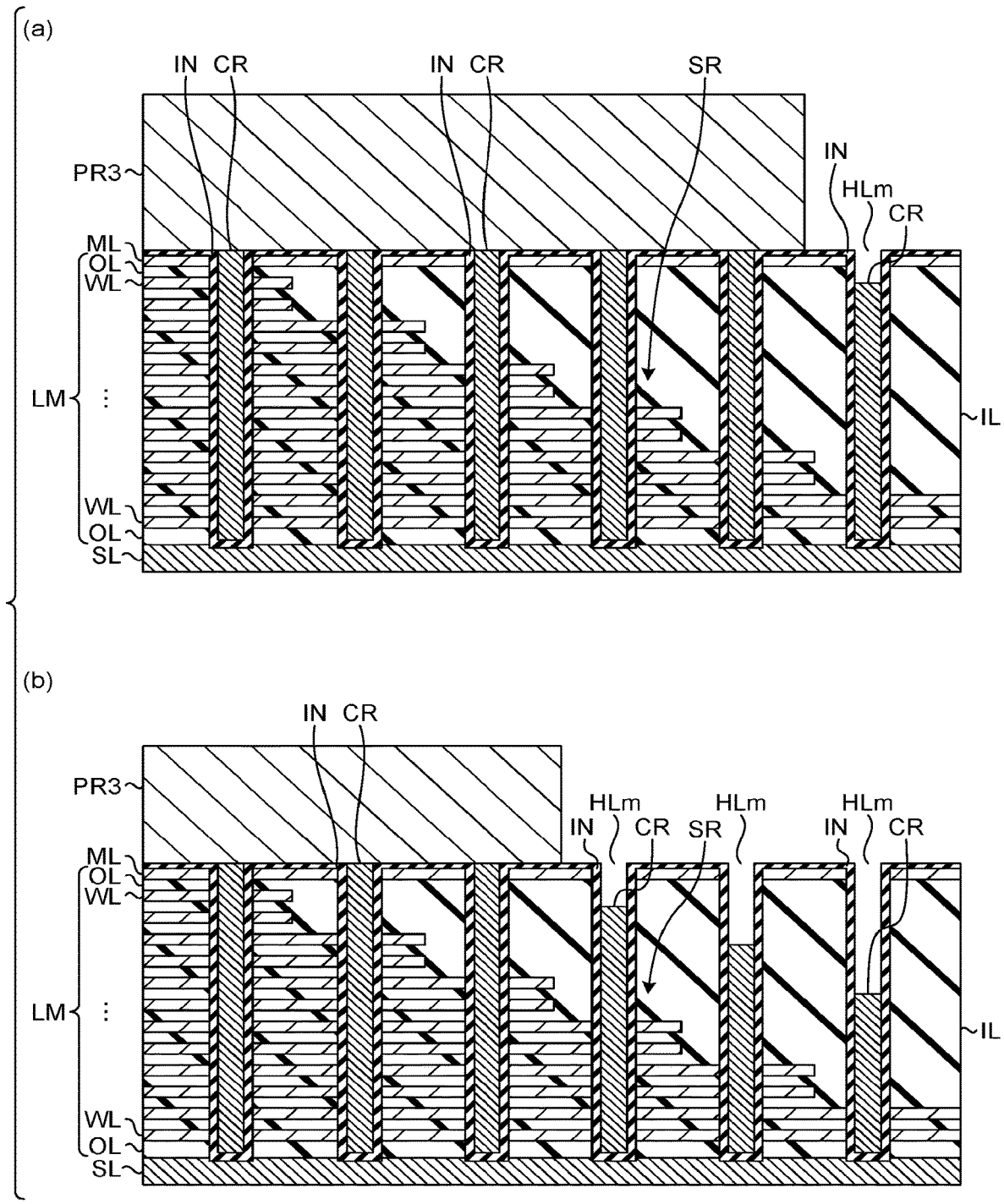
FIG. 11 is cross-sectional views schematically illustrating the manufacturing method of the semiconductor storage device according to the second embodiment.
Figure 12:
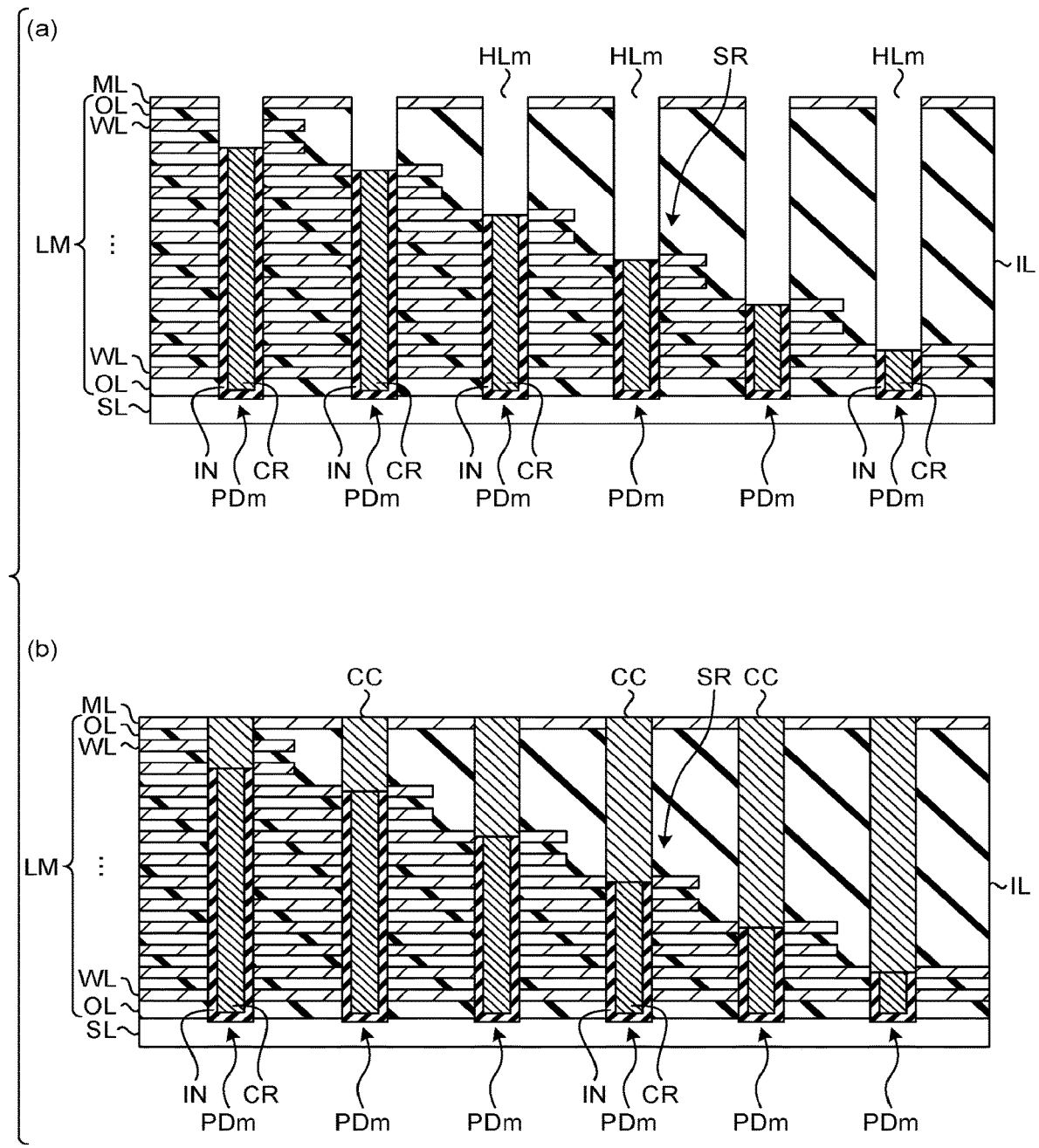
FIG. 12 is cross-sectional views schematically illustrating the manufacturing method of the semiconductor storage device according to the second embodiment.

Next, referring to FIGS. 10 through 12, explanation is made on a manufacturing method of the semiconductor storage device 2 according to the second embodiment. FIGS. 10 through 12 are cross-sectional views schematically illustrating the manufacturing method of the semiconductor storage device 2 according to the second embodiment.

The cell array region CA is formed by the same processes illustrated in FIG. 3 in the above-described first embodiment, for example.

Part (a) of FIG. 10 is a view illustrating a process corresponding to the process of Part (c) of FIG. 3 in the first embodiment. Namely, through processes up to this process, the stair portion SR formed from the stacked body LMs is obtained; the stair portion SR is covered by the inter-layer insulating layer IL; and the insulating layer ML is formed on the inter-layer insulating layer IL.

Then, as illustrated in Part (a) of FIG. 10, holes HLm are formed in corresponding positions above the steps of the stair portion SR. The holes HLm penetrate through the insulating layer ML, the inter-layer insulating layer IL, and the stacked body LMs, and reach the source line SL.

As illustrated in Part (b) of FIG. 10, the insulating members IN are formed to cover the insulating layer ML, and the sidewall and the bottom surface of the holes HLm. Then, the electrically conductive members CR are formed to fill spaces defined by the insulating members IN formed within the corresponding holes HLm. The electrically conductive member CR that covers the insulating member IN on the insulating layer ML is removed.

As illustrated in Part (c) of FIG. 10, the sacrificial layers NL between the insulating layers OL are removed through slits (not illustrated), and an electrically conductive material such as tungsten is filled into the spaces formed by removing the sacrificial layers NL. With this, the word lines WL are formed, and thus the stacked body LM is formed in which the word lines WL and the insulating layers OL are stacked alternately one on the other.

As illustrated in Part (a) of FIG. 11, a resist pattern PR3 is formed on the insulating member IN formed on the insulating layer ML in the stair portion SR. From the edge portion of the resist pattern PR3, the hole HLm formed with respect to the lowermost step of the stair portion SR is exposed. Then, the electrically conductive member CR that has been filled into the exposed hole HLm is etched back to a predetermined depth.

As illustrated in Part (b) of FIG. 11, while the resist pattern PR3 is slimmed and thus the holes HLm on the upper side are exposed in sequence from the edge portion of the resist pattern PR3, the electrically conductive member CR within the exposed holes HLm are etched back, accordingly. With this, the electrically conductive member CR within the holes HLm formed with respect to the steps closer to the lowermost step is etched back to further deeper positions. On the other hand, the electrically conductive member CR within the holes HLm formed with respect to the steps closer to the uppermost step is etched back to relatively shallower positions.

After the electrically conductive member CR have been etched down to a position corresponding to the uppermost word line WL in each step of the stair portion SR, as illustrated in Part (a) of FIG. 12, the insulating member IN on the side surface of the hole HLm is removed to a predetermined depth by a wet-etching method. With this, the side surfaces of the uppermost word lines WL in the corresponding holes HLm are exposed within the holes HLm.

At this time, a part of the electrically conductive members CR among the electrically conductive members CR formed with respect to the steps of the stair portion SR may have protrusion portions that protrude from the upper end portion of the insulating member IN, as illustrated in Part (a) of FIG. 7 in the first embodiment. Alternatively, all the electrically conductive members CR may have the protrusion portions. Here, it is thought that in the holes HLm formed with respect to the steps on the upper side, where upper end portions of the electrically conductive member CR and the insulating member IN are located in shallower position, the protrusion portions tend to protrude to a greater degree.

With all these processes, the pedestal PDm is formed for each step of the stair portion SR.

As illustrated in Part (b) of FIG. 12, an electrically conducive material is filled into the holes HLm. The electrically conductive material formed on the insulating layer ML is removed by the CMP method or the like.

With this, the contact CC is formed in each hole HLm. The contact CC is connected at the side surface thereof with the uppermost word line WL in the hole HLm and has the pedestal PDm arranged therebelow. When the electrically conductive member CR has the protrusion portion and the contact CC has the recess portion at the bottom portion thereof, the protrusion portion may be fitted into the recess portion.

Subsequently, the contacts CH, V0, the bit lines BL, and upper connection lines and the like are formed in the same manner as explained in the first embodiment.

With all these processed, the semiconductor storage device 2 according to the second embodiment is manufactured.

The semiconductor storage device 2 according to the second embodiment may provide the same advantages as those provided by the semiconductor storage device 1 according to the first embodiment.

Incidentally, while the semiconductor storage device 1 according to the first embodiment has the two rows of stairs in the stair portion SR in the above explanation, the device 1 may have only one row of stairs, where the word lines WL closer to the cell array region CA are arranged higher by one-step. Additionally, the stair portion SR may have three or more rows of stairs, where the word lines WL closer to the cell array region CA are arranged higher by three or more steps.

The semiconductor storage device 1 according to the first embodiment is explained above, assuming that the peripheral circuit is provided below or laterally to the stacked body LM. However, the semiconductor storage device 1 may have the peripheral circuit above the stacked body LM. Such a configuration may be realized by preparing a semiconductor substrate where the peripheral circuit is arranged and another substrate where the stacked body is formed, and bonding the stacked body and the semiconductor substrate having the peripheral circuit formed thereon. Even in this case, the stacked body is formed on the source line, and the stacked body is bonded along with the source line to the semiconductor substrate having the peripheral circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a stacked body in which a plurality of electrically conductive layers and a plurality of insulating layers are stacked alternately one on another, the stacked body including a stair portion in which end portions of the plurality of electrically conductive layers are stair-shaped;
    a pillar that penetrates through the stacked body, the pillar including memory cells in positions where the plurality of electrically conductive layers are in contact with the pillar;
    a contact arranged in the stair portion, the contact being connected at a side surface thereof to an nth (where n is an integer of 2 or larger) electrically conductive layer from the lowermost electrically conductive layer among the plurality of electrically conductive layers; and
    a pedestal provided under the contact, the pedestal being buried within an (n−1)th electrically conductive layer from the lowermost electrically conductive layer among the plurality of electrically conductive layers, the pedestal including an electrically conductive member having a bottom surface and side surfaces and being different from the contact in material, and an insulating member surrounding the bottom surface and side surfaces of the electrically conductive member so as to electrically isolate the pedestal from the (n−1)th electrically conductive layer within which the pedestal is buried, the electrically conductive member including an upper end portion connected to a lower end portion of the contact.

2. The semiconductor storage device according to claim 1, wherein an outer wall of the insulating member is continuous with a sidewall of the contact.

3. The semiconductor storage device according to claim 1, wherein
    the contact has a recess portion at the lower end portion of the contact;
    the electrically conductive member of the pedestal has a protrusion portion at the upper end portion of the electrically conductive member; and
    the protrusion portion is fitted into the recess portion.

4. The semiconductor storage device according to claim 1, wherein
    the insulating member has a bottomed cylindrical shape;
    the electrically conductive member has a solid cylindrical shape; and
    the electrically conductive member is fitted into the insulating member.

5. The semiconductor storage device according to claim 1, wherein
    the upper end portion of the electrically conductive member protrudes from the insulating member.

6. The semiconductor storage device according to claim 5, wherein
    the upper end portion of the electrically conductive member, the upper end portion protruding from the insulating member, is fitted into a recess portion provided with a lower end portion of the contact.

7. The semiconductor storage device according to claim 1, wherein
    an upper end portion of the insulating member is located higher than an upper surface of the (n−1)th electrically conductive layer and lower than a lower surface of the nth electrically conductive layer.

8. The semiconductor storage device according to claim 1, wherein
    the insulating member is interposed between the electrically conductive member and the (n−1)th electrically conductive layer.

9. The semiconductor storage device according to claim 1, wherein the pedestal is provided to the contact that is formed with respect to a highest step of the stair portion, among a plurality of the contacts.

10. The semiconductor storage device according to claim 1, wherein
the pedestal is provided to the contact that is formed with respect to a second highest step of the stair portion, among a plurality of the contacts.

11. The semiconductor storage device according to claim 1, wherein
the pedestal is provided to each of a plurality of the contacts.

12. The semiconductor storage device according to claim 1, wherein
each step of the stair portion includes at least one electrically conductive layer among the plurality of the electrically conductive layers, and at least one insulating member that is adjacent to the at least one electrically conductive layer, among the plurality of the insulating member.

13. The semiconductor storage device according to claim 1, wherein
the stair portion is divided into two rows of stairs; and
steps of one of the two rows of stairs are higher by one-step than corresponding steps of the other of the two rows of stairs.

14. The semiconductor storage device according to claim 1, wherein
a material of the contact is metal, and
a material of the electrically conductive member is amorphous silicon or poly-silicon.

15. The semiconductor storage device according to claim 1, wherein a lower end portion of the pedestal is located in a lowermost layer of the stacked body.

16. The semiconductor storage device according to claim 1, wherein the contact and the pedestal are equal in diameter.

* * * * *